(12) United States Patent
Matick et al.

(10) Patent No.: US 7,460,387 B2
(45) Date of Patent: *Dec. 2, 2008

(54) EDRAM HIERARCHICAL DIFFERENTIAL SENSE AMP

(75) Inventors: Richard E. Matick, Cortlandt Manor, NY (US); Stanley E. Schuster, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

This patent is subject to a terminal disclaimer.

(21) Appl. No.: 11/620,328

(22) Filed: Jan. 5, 2007

(65) Prior Publication Data

US 2008/0165601 A1 Jul. 10, 2008

(51) Int. Cl.
*G11C 5/06* (2006.01)
*G11C 11/24* (2006.01)
*G11C 7/00* (2006.01)

(52) U.S. Cl. .................. 365/63; 365/149; 365/156; 365/193; 365/202; 365/205

(58) Field of Classification Search ............ 365/63, 365/149, 156, 202, 193
See application file for complete search history.

(56) References Cited

U.S. PATENT DOCUMENTS

| | | | |
|---|---|---|---|
| 4,633,443 A | 12/1986 | Childers | |
| 5,675,529 A | 10/1997 | Poole | |
| 5,917,744 A | 6/1999 | Kirihata et al. | |
| 5,917,745 A | 6/1999 | Fujii | |
| 5,973,983 A | 10/1999 | Hidaka | |
| 6,115,307 A * | 9/2000 | Casper | 365/202 |
| 6,130,845 A | 10/2000 | Ootsuki et al. | |
| 6,278,630 B1 | 8/2001 | Yamada | |
| 6,288,969 B1 | 9/2001 | Gibbins et al. | |
| RE37,409 E | 10/2001 | Barth et al. | |
| 6,333,866 B1 | 12/2001 | Ogata | |
| 6,426,905 B1 | 7/2002 | Dennard et al. | |
| 6,442,060 B1 | 8/2002 | Leung et al. | |
| 6,448,818 B1 | 9/2002 | Fletcher | |
| 6,449,201 B1 | 9/2002 | Kojima | |
| 6,456,521 B1 | 9/2002 | Hsu et al. | |
| 6,542,424 B2 | 4/2003 | Endo et al. | |
| 6,650,572 B2 | 11/2003 | Issa | |
| 6,657,886 B1 | 12/2003 | Adams et al. | |
| 6,735,135 B2 * | 5/2004 | Issa | 365/205 |
| 6,898,663 B2 | 5/2005 | Winograd et al. | |
| 6,901,017 B2 | 5/2005 | Shimizu | |

(Continued)

FOREIGN PATENT DOCUMENTS

EP 1498903 A2 1/2005

(Continued)

*Primary Examiner*—Ly D Pham
(74) *Attorney, Agent, or Firm*—Cantor Colburn LLP; Mark Wardas

(57) ABSTRACT

In an embodiment of the present invention, a hierarchical differential sensing approach is effectuated wherein an array of 1T DRAM cells are organized in rows and columns in which the rows represent words and the columns represent bits of the word, each bit column having more than one pair of balanced, true and complement local bit lines, the local bit lines being connected to a pair of balanced, true and complement global bit lines by way of CMOS transistor switches.

8 Claims, 9 Drawing Sheets

U.S. PATENT DOCUMENTS

| | | |
|---|---|---|
| 7,057,230 B2 | 6/2006 | Tanaka et al. |
| 7,082,076 B2 | 7/2006 | Terzioglu et al. |
| 7,088,638 B1 | 8/2006 | Bunce et al. |
| 2005/0018510 A1 | 1/2005 | Terzioglu et al. |
| 2005/0125591 A1 | 6/2005 | Fujimoto |
| 2005/0141258 A1 | 6/2005 | Kang et al. |
| 2006/0023553 A1 | 2/2006 | Takeyama et al. |
| 2006/0067144 A1 | 3/2006 | Liu |
| 2008/0031029 A1* | 2/2008 | Liaw .......................... 365/63 |

FOREIGN PATENT DOCUMENTS

| | | |
|---|---|---|
| JP | 2004153700 | 5/2004 |

* cited by examiner

| Time | delta V LBL | delta V GBL |
|---|---|---|
| WL to CLK2  250ps | 215mV | 0mV |
| WL to CLK1  350ps | 403mV | 0mV |
| WL to CLK3  450ps | 348mV | 170mV |
| WL to CLK3N 500ps | 443mV | 273mV |

Vcell = 0.8V

Fig. 6

| Time | delta V LBL | delta V GBL |
|---|---|---|
| WL to CLK2 | 250ps | 197mV | 0mV |
| WL to CLK1 | 350ps | 620mV | 0mV |
| WL to CLK3 | 450ps | 533mV | 259mV |
| WL to CLK3N | 500ps | 638mV | 391mV |

Vcell = 0.0V

EDRAM HIERARCHICAL DIFFERENTIAL SENSE AMP

CROSS-REFERENCE TO RELATED APPLICATIONS

This application contains subject matter, which is related to the subject matter of the following co-pending applications, each of which is assigned to the same assignee as this application, International Business Machines Corporation of Armonk, N.Y. Each of the below listed applications is hereby incorporated herein by reference in its entirety:

entitled 'Hierarchical Six-Transistor SRAM', Ser. No. 11/620,297;

entitled 'Hierarchical 2T-DRAM with Self-Timed Sensing', Ser. No. 11/620,282;

entitled 'Fast, Stable SRAM cell using seven devices and hierarchical bit/sense line', Ser. No. 11/620,316; and entitled 'DRAM Hierarchical Data Path', Ser. No. 11/108,369.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a hierarchical differential sensing approach and in particular to an array of 1T DRAM cells are organized in rows and columns in which the rows represent words and the columns represent bits of the word, each bit column having more than one pair of balanced, true and complement local bit lines, the local bit lines being connected to a pair of balanced, true and complement global bit lines by way of CMOS transistor switches.

2. Description of Background

Random access memories (RAMs) are well known in the art. A typical RAM has a memory array wherein every location is addressable and freely accessible by providing the correct corresponding address. Dynamic RAMs (DRAMs) are dense RAMs with a very small memory cell. High performance Static RAMs (SRAMs) are somewhat less dense (and generally more expensive per bit) than DRAMs, but expend more power in each access to achieve speed, i.e., provide better access times than DRAMs at the cost of higher power. In a typical data processing system, the bulk of the memory is DRAM in main memory with faster SRAM in cache memory, closer to the processor or microprocessor. Caching is an effective technique for increasing microprocessor performance. RAMs are commonly made in the well-known complementary insulated gate field effect transistor (FET) technology known as CMOS.

A typical CMOS logic circuit, for example, includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is 'ON' and conducting (ideally modeled as a resistor (R) in series with the closed switch), the other device (the PFET) is 'OFF', not conducting (ideally modeled as an open switch) and, vice versa. For example, a CMOS inverter is a series connected PFET and NFET pair that are connected between a power supply voltage (Vdd) and ground (GND). A typical static random access memory (SRAM) cell ideally includes a balanced pair of cross-coupled inverters storing a single data bit with a high at the output of one inverter and a low at the output of the other. A pair of pass gates (also ideally, a balanced pair of FETs) selectively connects the complementary outputs of the cross-coupled inverter to a corresponding complementary pair of bit lines. A word line connected to the gates of the pass gate FETs selects connecting the cell to the corresponding complementary pair of bit lines. During a cell access, the pass gates are turned 'ON' to couple the bit line contents to the cross-coupled inverters. In a well designed SRAM, once data is stored in a cell and unless power is lost, the cell maintains that data until it is overwritten.

A DRAM cell is essentially a capacitor for storing charge and a switch, a pass transistor (also called a pass gate or access transistor) that switches 'ON' and 'OFF' to transfer charge to and from the capacitor. Thus, a typical DRAM cell is much smaller (denser) than a typical SRAM cell, e.g., <¼. Data (1 bit) stored in the cell is determined by the absence or presence of charge on the storage capacitor. Since each cell has numerous leakage paths from the storage capacitor, unless it is periodically refreshed, charge stored on the storage capacitor eventually leaks off. Each DRAM cell is read by coupling the cell's storage capacitor (through the access transistor) to a bit line, which is a larger capacitance, and measuring the resulting voltage difference on the bit line. Since each time a cell is read, the voltage on the storage capacitor is equalized with the voltage on the bit line, the cell's contents are destroyed by the read, i.e., a destructive read.

As is further well known in the art, the maximum voltage that an FET pass gate will pass is its gate to source voltage ($V_{gs}$) reduced by the FET turn-on or threshold voltage ($V_T$), i.e., the stored voltage ($V_{St}$) on the storage capacitor ($C_{cell}$) is $V_{St}=V_{gs}-V_T$. The magnitude of the signal ($V_{sig}$) transferred to the bit line with capacitance $C_{BL}$ is $V_{sig}=C_{cell}V_{St}/(C_{cell}+C_{BL})$. In a typical state of the art DRAM (e.g., 256 Mbit or 1 Gbit) with up to 512 or even 1024 bits on each bit line, $C_{BL}$ is at least one order of magnitude larger than $C_{cell}$. So, $V_{sig}$ is typically at least an order of magnitude smaller than the supply voltage, $V_{dd}$, and is, typically, a few hundred millivolts (mv). Further, that signal develops exponentially with a time constant dependent upon the overall RC time constant of the signal path, i.e., where 'R' includes the FET on resistance and $C=C_{cell}+C_{BL}$. Thus, developing a sufficient bit line signal to sense, i.e. to transfer a portion of $V_{St}$ to the bit line, typically accounts for most of the read time of a state of the art DRAM.

Unfortunately, DRAM read time has been much longer than SRAM read time, e.g., an order of magnitude. Consequently, this longer read time has been a significant deterrent to using DRAM in high performance logic chips and the primary reason less dense but faster SRAM is used for cache memory.

Thus, there is a need for high performance DRAMs, especially with reduced cell read times and more particularly, for high performance DRAMs suitable for embedded use in logic chips.

SUMMARY OF THE INVENTION

The shortcomings of the prior art are overcome and additional advantages are provided through the provision of a DRAM memory array comprising a plurality of memory cells, each of the plurality of memory cells further comprising a device, each of the plurality of memory cells having one of the devices organized in a row representing a plurality of word lines or a bit column representing bits of the plurality of word lines, each bit column having more than one pair of a local bit line true, and a local bit line complement, the local bit line true and the local bit line complement are balanced, the local bit line true is connected by way of a first CMOS transistor switch to a global bit line true and the local bit line complement is connected by way of a second CMOS transistor switch to a global bit line complement, the global bit line true and the global bit line complement are balanced.

Also, the shortcomings of the prior art are overcome and additional advantages are provided through the provision of a method of data accessing a DRAM memory array, the method comprising initializing data access, the DRAM memory array comprising a plurality of memory cells, each of the plurality of memory cells further comprising a device, each of the plurality of memory cells having one of the devices organized in a row representing a plurality of word lines or a bit column representing bits of the plurality of word lines, each bit column having more than one pair of a local bit line true, and a local bit line complement, the local bit line true and the local bit line complement are balanced, the local bit line true is connected by way of a first CMOS transistor switch to a global bit line true and the local bit line complement is connected by way of a second CMOS transistor switch to a global bit line complement, the global bit line true and the global bit line complement are balanced; a first stage differential sense amplifier, the first stage differential sense amplifier having a cross coupled differential half latch connected to each of the local bit line true and the local bit line complement, the first stage differential sense amplifier being responsive to the first timing pulse effectuating the setting of the first stage differential sense amplifier; a second stage global sense amplifier, the second stage global sense amplifier having a full cross coupled latch connected to each of the global bit line true and the global bit line complement, the second stage global sense amplifier being responsive to a global timing pulse effectuating the setting of the second stage global sense amplifier; and the plurality of word lines are 'LOW' or 'OFF', the local bit line true, the local bit line complement, the global bit line true, and the global bit line complement are charged to approximately one-half power supply voltage, the first CMOS transistor switch and the second CMOS transistor switch are 'ON', and the first stage differential sense amplifier and the second stage global sense amplifier are 'OFF'; switching the first CMOS transistor switch and the second CMOS transistor switch are switched 'OFF', accessed the plurality of word lines transition 'HIGH' turning 'ON' an access transistor between a first cell storage capacitor associated with the local bit line true or a second cell storage capacitor associated with the local bit line complement; developing a differential voltage across the local bit line true and the local bit line complement resultant from accessed the plurality of memory cells being turned 'ON'; transitioning the first timing pulse effectuating the setting of the first stage differential sense amplifier; switching the first CMOS transistor switch and the second CMOS transistor switch 'ON'; and transitioning the global timing pulse effectuating the setting of the second stage global sense amplifier, wherein a full power supply voltage appears across the local bit line true and the local bit line complement.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which is a DRAM memory array that utilizes hierarchical differential sensing. Such an implementation having advantages that include extremely low leakage and low active power as a result of the one-half Vdd pre-charge, very simple and robust operation, fast restore for stored '1' and '0', simple write, fast cycle time, low latency, and low 1T cell leakage for a stored '1' as a result of one-half Vdd pre-charge, differential sensing is immune to common mode noise, and hierarchical differential sensing has a large margin to threshold voltage variability.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates one example of a table detailing the differential voltage buildup over time, with Vcell=0.8V;

FIG. 7 illustrates one example of a table detailing the differential voltage buildup over time, with Vcell=0V;

The detailed description explains the preferred embodiments of the invention, together with advantages and features, by way of example with reference to the drawings.

DETAILED DESCRIPTION OF THE INVENTION

Figure 1:
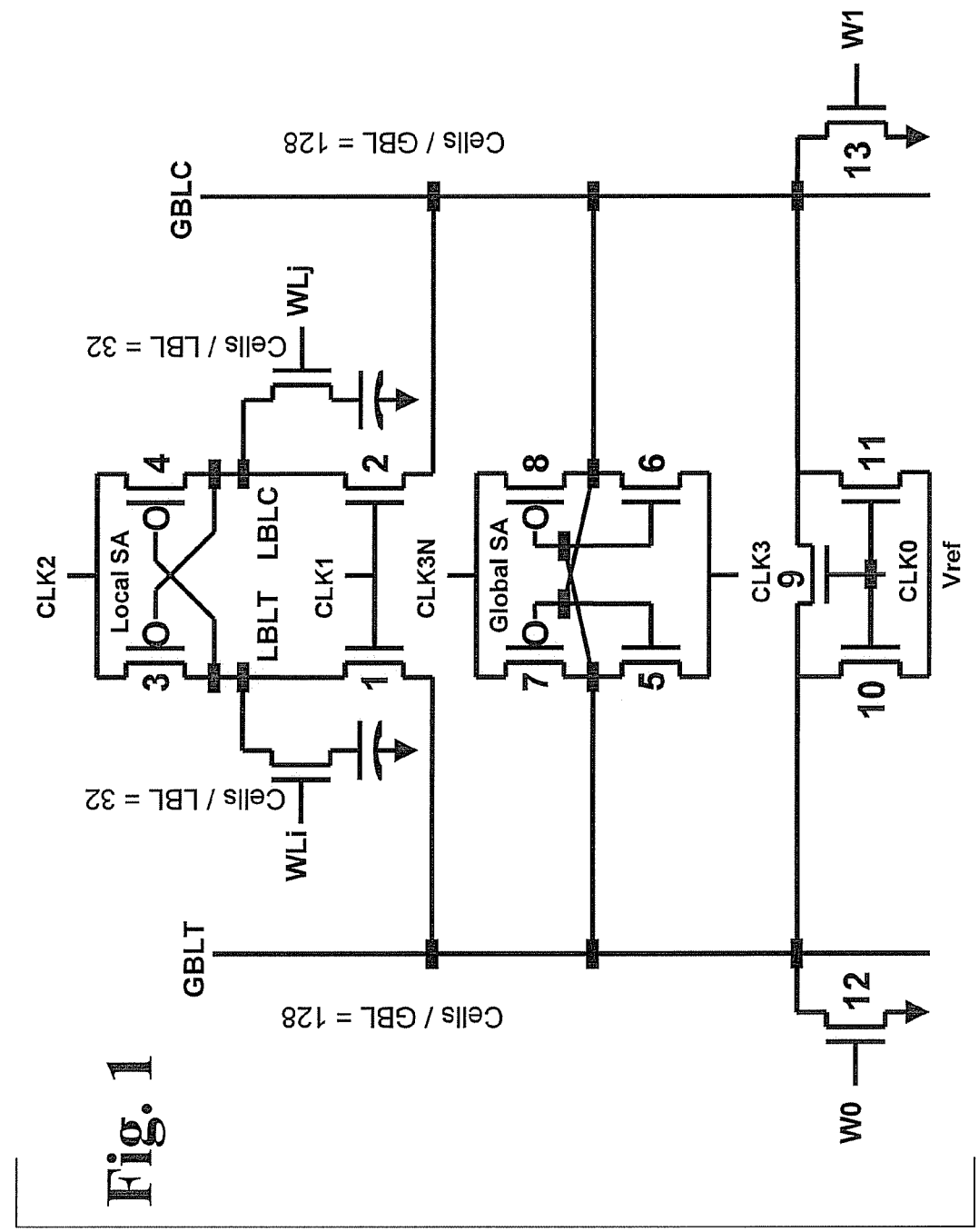
FIG. 1 illustrates one example of the operation of hierarchical differential sense amplifier.

Turning now to the drawings in greater detail, it will be seen that in FIG. 1 there is illustrated one example of the operation of a hierarchical differential sense amplifier. In an exemplary embodiment an approach to build on conventional differential sense amplifiers in the areas of leakage, power, and noise in part gives rise to the present invention. In this regard, the present invention combines a hierarchical approach with a conventional approach to achieve adequate differential voltage for sensing, robust operation with large threshold voltage variation, low latency, fast restore, and fast cycle. In FIG. 1 there is illustrated such a hierarchical differential sense amplifier comprising a local sense amplifier (Local SA), a global sense amplifier (Global SA), and other gating, latching, and clocking circuitry.

Figure 2:
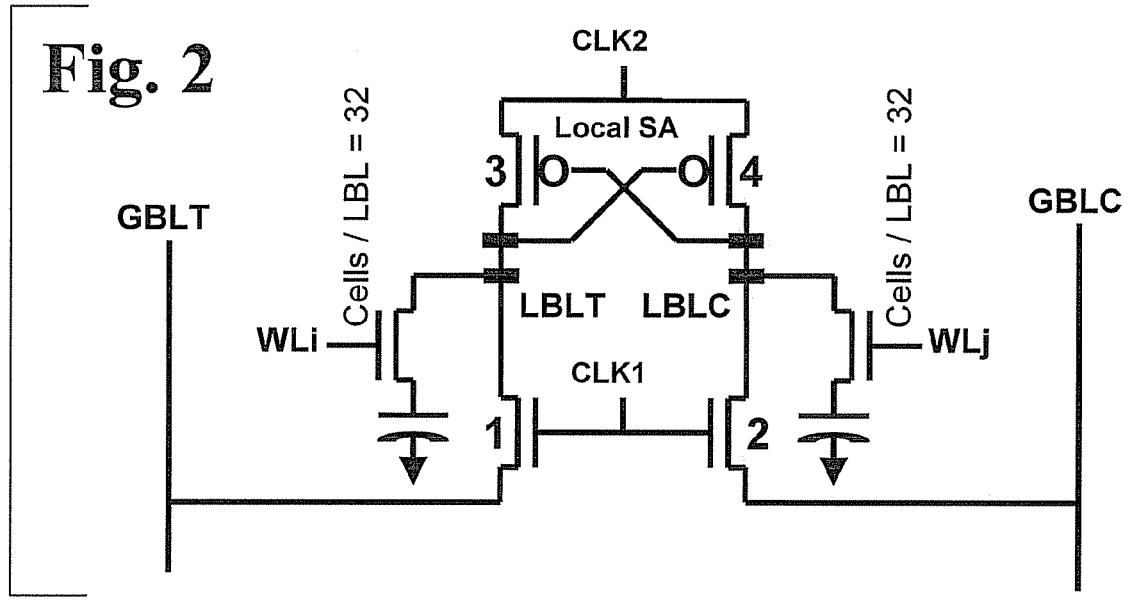
FIG. 2 illustrates one example of a local sense amplifier.
Figure 3:
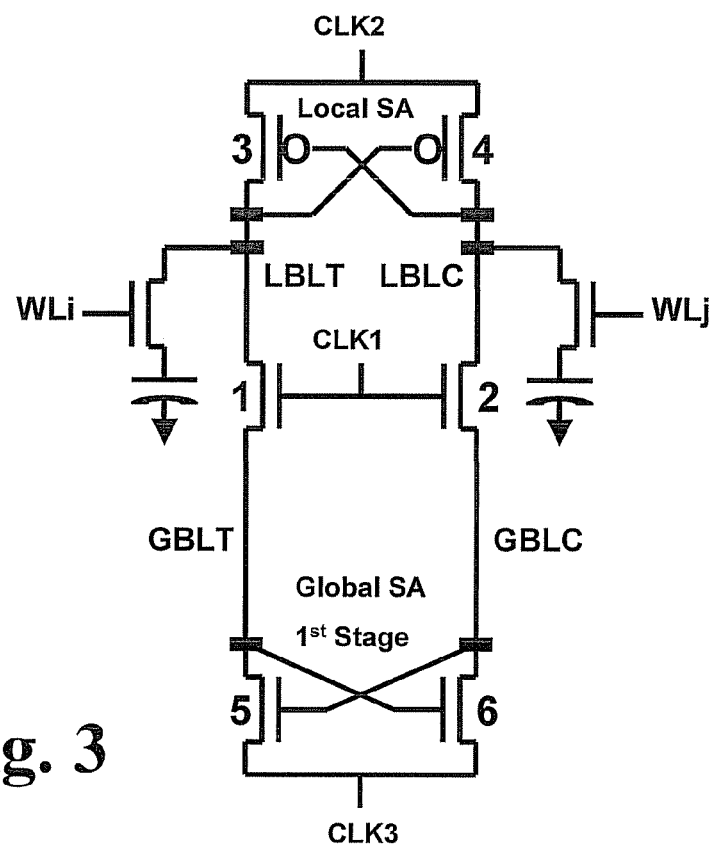
FIG. 3 illustrates one example of a global sense amplifier with first stage sense amplifier latch.

Referring to FIG. 2 there is illustrated one example of a local sense amplifier. In an exemplary embodiment this is a portion of the circuit illustrated in FIG. 1 dedicated to local sense amplification. In operation as CLK1 falls turning 'OFF' device 1 and device 2, local bit line true (LBLT), local bit line complement (LBLC), global bit line true (GBLT), and global bit line complement (GBLC) are at a reference voltage (Vref). Each local bit line, LBLT and LBLC, has one or more cells connected to it, the exact number being a design parameter and typically 8 to 64 (32 shown for illustration only). WL(i or j) then rises connecting the selected cell capacitance to local bit line true LBLT, and or local bit line complement LBLC. As a result, a differential voltage develops across the local bit line true LBLT, and the local bit line complement LBLC. CLK2 a clock signal then rises going 'HIGH'. Depending on the polarity of the differential voltage either device 3 or device 4 will turn 'ON' and the local bit line true LBLT or local bit line complement LBLC will rise, with the other local bit line LBL staying at the reference voltage Vref if unselected or Vref–delta V if selected where delta V is the differential sense voltage CLK1 clocking signal then rises going 'HIGH' turning 'ON' device 1 and device 2. This will result in either the global bit line true GLBT or the global bit line complement GLBC rising while the other global bit line GBL stays at a reference voltage Vref. 'ON' device 3 or device 4 then supplies current to charge up the global bit line GBL. In an exemplary embodiment for example, the devices referred to as device 1 through device 13 can be a transistor, CMOS transistor, nFET, or pFET Referring to FIG. 3 there is illustrated one example of a global sense amplifier with first stage sense amplifier latch. In an exemplary embodiment this is the lower portion of the global SA circuit illustrated in FIG. 1 dedicated to global sense amplification. In operation, after the local sense amplifier (local SA) sets, there will be a differential voltage across the local bit line true LBLT and the local bit line complement LBLC and either device 3 or device 4 will be 'ON'. Next CLK1 a clock signal rises 'HIGH' and this differential voltage is transferred to the global bit line GLBT and global bit line complement GLBC. Then CLK3 a clock signal falls 'LOW' and the first stage of the global sense amplifier (global SA) latches.

Figure 4:
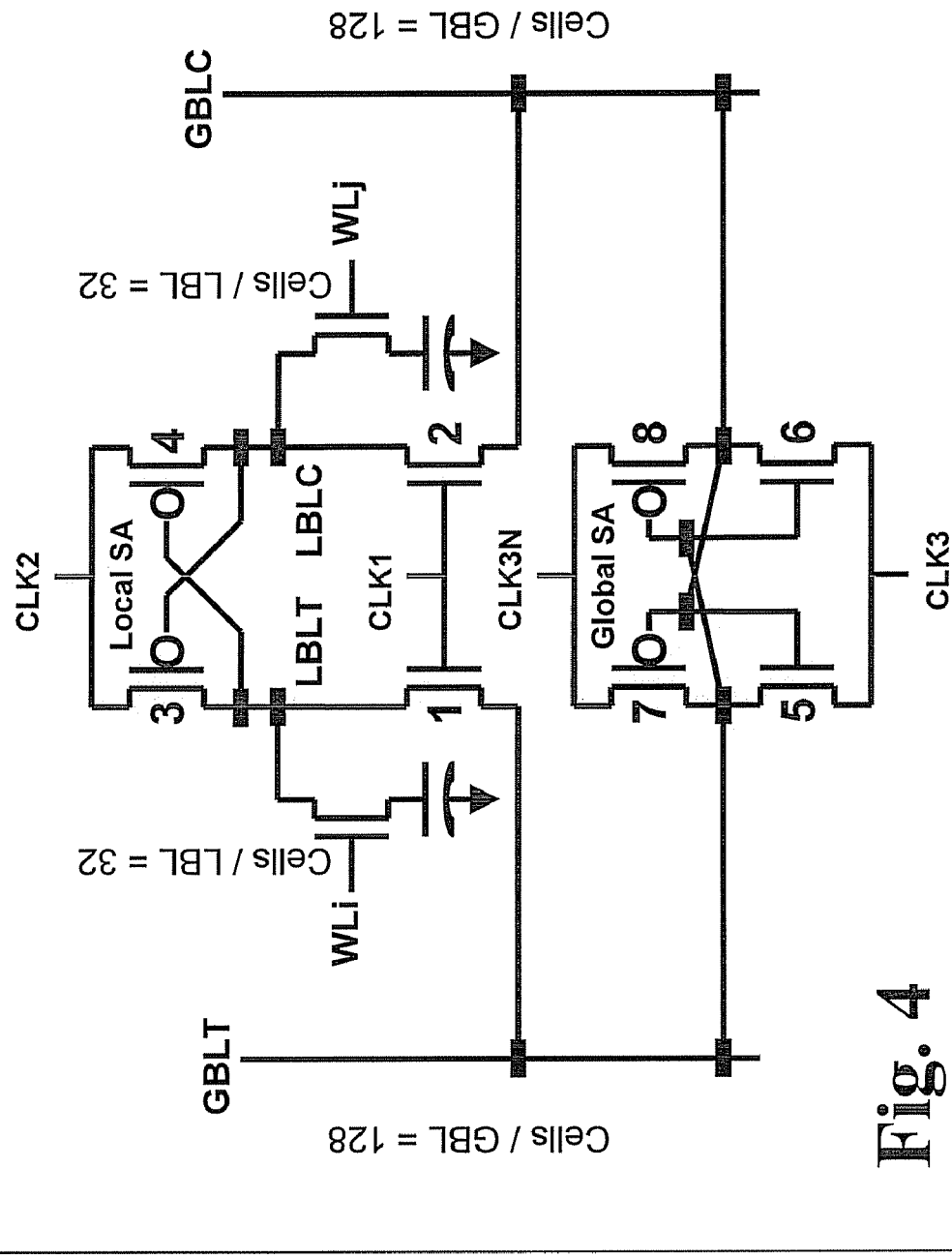
FIG. 4 illustrates one example of a global sense amplifier with second stage sense amplifier latch, obtained by adding pFETs to the first stage sense latch.

Referring to FIG. 4 there is illustrated one example of a global sense amplifier with second stage sense amplifier latch. In an exemplary embodiment continuing the circuit description of FIG. 1, FIG. 3 further illustrates the local sense amplifier (local SA) and global sense amplifier (global SA) operation. In operation, CLK3N a clocking signal rises 'HIGH' turning 'ON' device 7 or device 8. This action latches the second stage of the global sense amplifier (global SA) and causes either the global bit line true GLBT or the global bit line complement GBLC to go to a supply voltage Vdd. The global bit line that does not rise 'HIGH' is connected to ground (Gnd) through device 5 or device 6.

Figure 5:
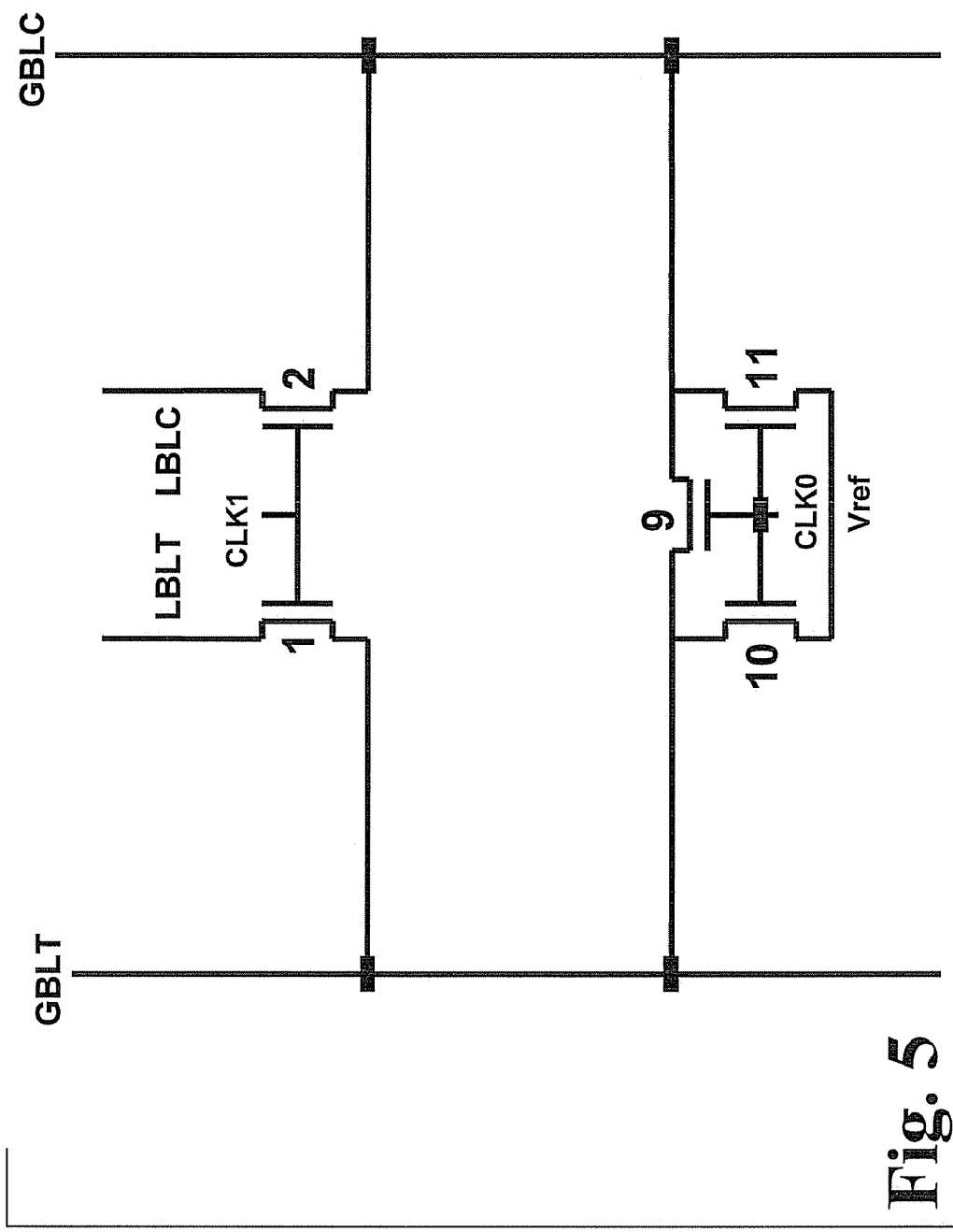
FIG. 5 illustrates one example of the pre-charge operation.

Referring to FIG. 5 there is illustrated one example of the pre-charge operation. In an exemplary embodiment this is a portion of the circuit illustrated in FIG. 1 dedicated to the pre-charge operation. In operation, at the end of a read or write cycle the true and complement bit lines will either be at a supply voltage Vdd or ground (Gnd). CLK1 a clocking signal is 'HIGH' and device 1 and device 2 are 'ON' for all local bit lines. CLK0 then rises 'HIGH' turning 'ON' device 9, device 10, and device 11. This results in both global bit lines and both local bit lines being charged to a reference voltage Vref. Most of the current flows through device 9 as the bit lines charge from a supply voltage Vdd and ground (Gnd) to a reference voltage Vref, which in an exemplary embodiment is approximately one-half of the supply voltage Vdd.

Referring to FIG. 6 there is illustrated one example of a table detailing the differential voltage buildup over time, with Vcell=0.8V. Referring to FIG. 7 there is illustrated one example of a table detailing the differential voltage buildup over time, with Vcell=0V. FIG. 6 and FIG. 7 illustrate differential charge build up over time with different Vcell voltages.

Figure 8:
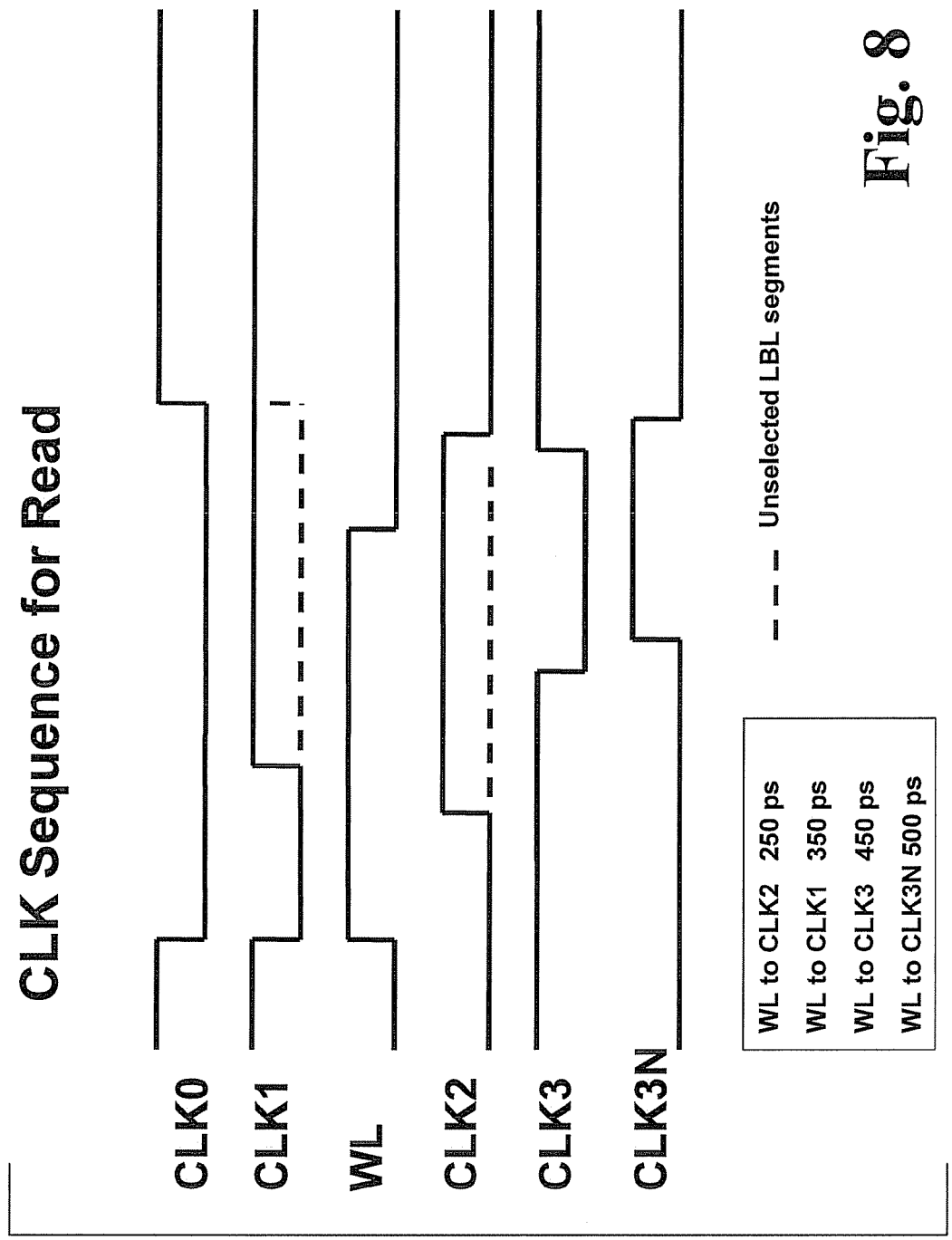
FIG. 8 illustrates one example of a clock sequence for a read data access.

Referring to FIG. 8 there is illustrated a clock sequence for a read data access. In an exemplary embodiment a clocking sequence for a read data access for the circuit detailed in the Figures can be effectuated with the clocking sequence illustrated in FIG. 8.

Figure 9:
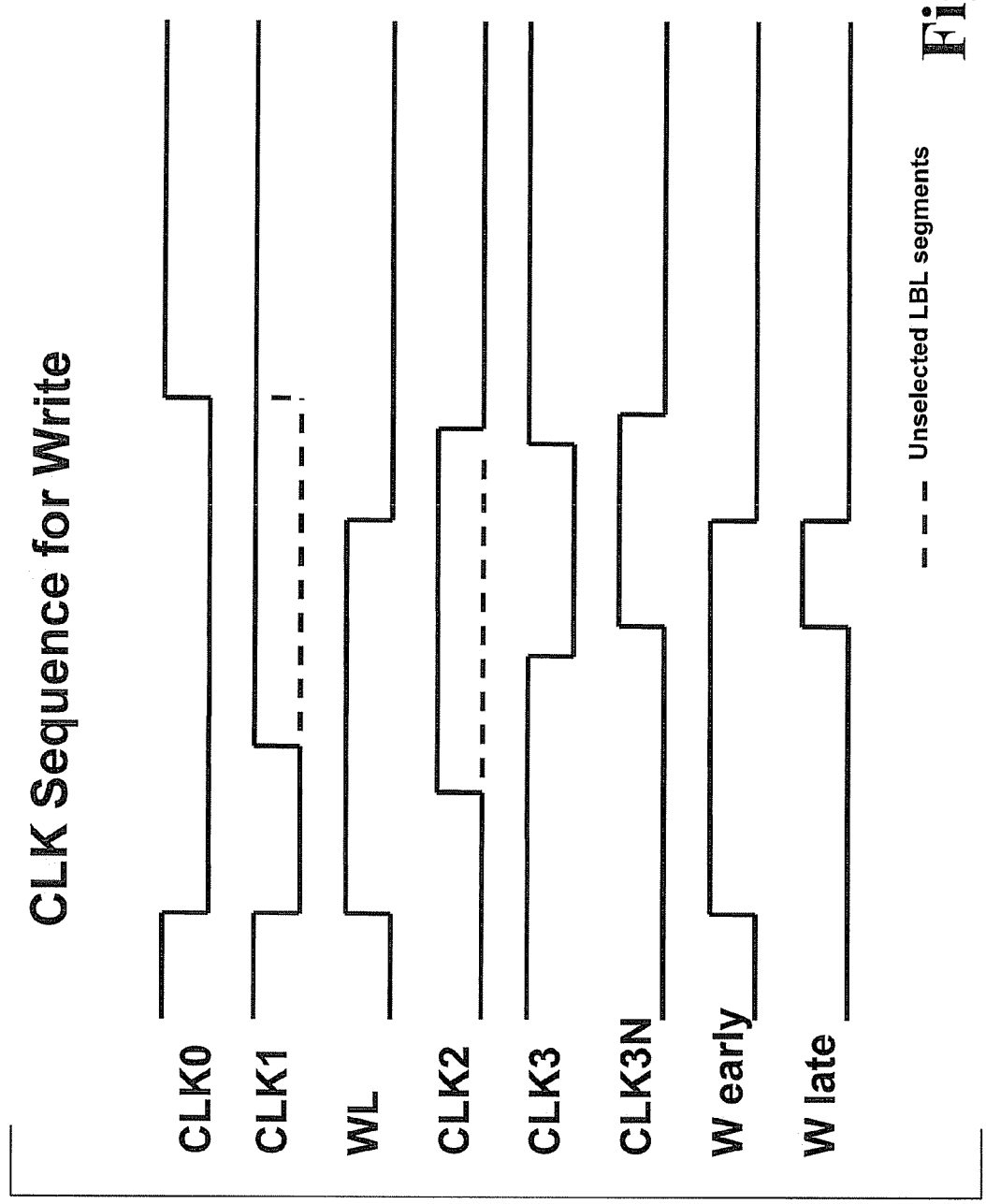
FIG. 9 illustrates one example of a clock sequence for a write data access.

Referring to FIG. 9 there is illustrated a clock sequence for a write data access. In an exemplary embodiment a clocking sequence for a write data access for the circuit detailed in the Figures can be effectuated with the clocking sequence illustrated in FIG. 9.

Figure 10:
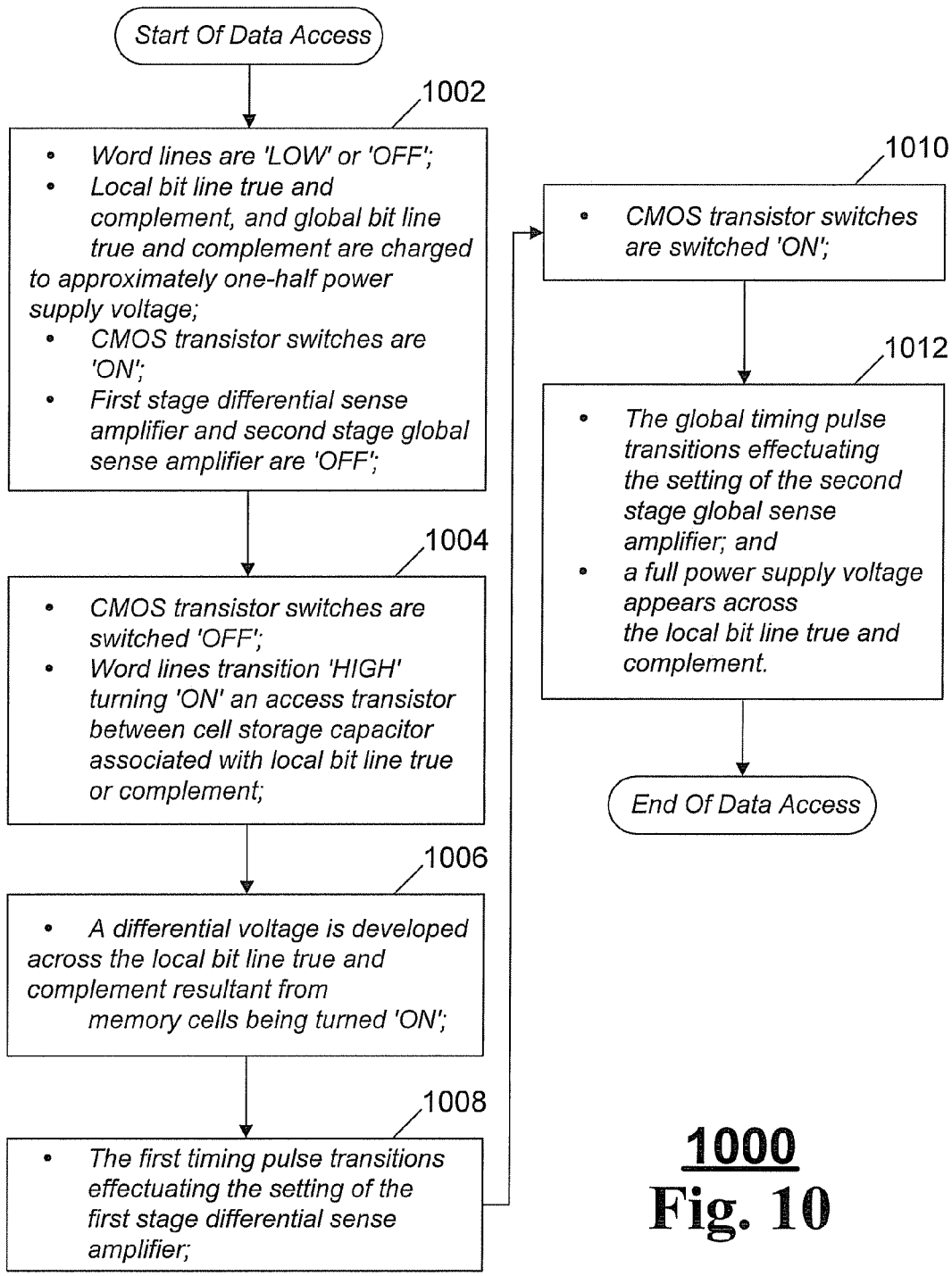
FIG. 10 illustrates one example of a method of DRAM memory array data access.

Referring to FIG. 10 there is illustrated one example of a method of DRAM memory array data access. In an exemplary embodiment one method of data accessing the circuit detailed in the Figures is illustrated in routine 1000. The method begins in block 1002.

In block 1002 the word lines are 'LOW' or 'OFF', the local bit line true and local bit line complement, as well as the global bit line true and global bit line complement are charged to approximately one-half the power supply voltage Vdd. In addition, the CMOS transistor switches are 'ON', and the first stage differential sense amplifier and second stage sense amplifier are 'OFF'. Processing then moves to block 1004.

In block 1004 the CMOS transistor switches are switched 'OFF' and the word lines transition 'HIGH' turning 'ON' an access transistor between cell storage capacitors associated with the local bit line true and local bit line complement. Processing then moves to block 1006.

In block 1006 a differential voltage is developed across the local bit line true and local bit line complement resultant from memory cells being turned 'ON'. Processing then moves to block 1008.

In block 1008 the first timing pulse transitions effectuating the setting of the first stage differential sense amplifier. Processing then moves to block 1010.

In block 1010 the CMOS transistor switches are switched 'ON'. Processing then moves to block 1012.

In block 1012 the global timing pulse transitions effectuating the setting of the second stage global sense amplifier. In addition, the full power supply voltage appears across the local bit line true and the local bit line complement. The routine is then exited.

In an exemplary embodiment the hierarchical differential sensing of the present invention has many advantages. Such advantages include extremely low leakage and low active power as a result of the one-half Vdd pre-charge. Other advantages are very simple and robust operation, fast restore for stored '1' and '0', simple write, fast cycle time low latency, and low 1T cell leakage for a stored '1' as a result of one-half Vdd pre-charge. Other advantages can include differential sensing is immune to common mode noise, and hierarchical differential sensing has a large margin to threshold voltage variability.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A DRAM memory array comprising:
 a plurality of memory cells, each of said plurality of memory cells further comprising:
  a device, each of said plurality of memory cells having one of said device organized in a row representing a plurality of word lines or a bit column representing bits of said plurality of word lines, each said bit column having more than one pair of a local bit line true, and a local bit line complement, said local bit line true and said local bit line complement are balanced, said local bit line true is connected by way of a first CMOS transistor switch to a global bit line true and said local bit line complement is connected by way of a second CMOS transistor switch to a global bit line complement, said global bit line true and said global bit line complement are balanced;
  a first stage differential sense amplifier, said first stage differential sense amplifier having a cross coupled differential half latch connected to each of said local bit line true and said local bit line complement, said first stage differential sense amplifier being responsive to a first timing pulse effectuating the setting of said first stage differential sense amplifier; and
  a second stage global sense amplifier, said second stage global sense amplifier having a full cross coupled latch connected to each of said global bit line true and said global bit line complement, said second stage global sense amplifier being responsive to a plurality of global timing pulses effectuating the setting of said second stage global sense amplifier.

2. The DRAM memory array in accordance with claim 1, wherein said device is a transistor, CMOS transistor, nFET, or pFET.

3. The DRAM memory array in accordance with claim 1, wherein data access of said DRAM memory array is performed as follows:
 at start of data access, said plurality of word lines are 'LOW' or 'OFF', said local bit line true, said local bit line complement, said global bit line true, and said global bit line complement are charged to approximately one-half power supply voltage, said first CMOS transistor switch and said second CMOS transistor switch are 'ON', and said first stage differential sense amplifier and said second stage global sense amplifier are 'OFF';
 next said first CMOS transistor switch and said second CMOS transistor switch are switched 'OFF', accessed said plurality of word lines transition 'HIGH' turning 'ON' an access transistor between a first cell storage capacitor associated with said local bit line true or a second cell storage capacitor associated with said local bit line complement;
 next a differential voltage is developed across said local bit line true and said local bit line complement resultant from accessed said plurality of memory cells being turned 'ON';
 next said first timing pulse transitions effectuating the setting of said first stage differential sense amplifier;
 next said first CMOS transistor switch and said second CMOS transistor switch are switched 'ON'; and
 next said plurality of global timing pulses transition effectuating the setting of said second stage global sense amplifier, wherein a full power supply voltage appears across said local bit line true and said local bit line complement.

4. The DRAM memory array in accordance with claim 3, wherein said first stage differential sense amplifier is immune to common mode noise.

5. The DRAM memory array in accordance with claim 4, wherein said second stage global sense amplifier is immune to common mode noise.

6. A method of data accessing a DRAM memory array, said DRAM memory array comprising a plurality of memory cells, each of said plurality of memory cells further including
 a device, each of said plurality of memory cells having one of said device organized in a row representing a plurality of word lines or a bit column representing bits of said plurality of word lines, each said bit column having more than one pair of a local bit line true, and a local bit line complement, said local bit line true and said local bit line complement are balanced, said local bit line true is connected by way of a first CMOS transistor switch to a global bt line true and said local bit line complement is connected by way of a second CMOS transistor switch to a global bit line complement, said global bit line true and said global bit line complement are balanced;
 a first stage differential sense amplifier, said first stage differential sense amplifier having a cross coupled differential half latch connected to each of said local bit line true and said local bit line complement, said first stage differential sense amplifier being responsive to a first timing pulse effectuating the setting of said first stage differential sense amplifier;
 a second stage global sense amplifier, said second stage global sense amplifier having a full cross coupled latch connected to each of said global bit line true and said global bit line complement, said second stage global sense amplifier being responsive to a global timing pulse effectuating the setting of said second stage global sense amplifier; and said plurality of word lines are 'LOW' or 'OFF', said local bit line true, said local bit line complement, said global bit line true, and said global bit line complement are charged to approximately one-half power supply voltage, said first CMOS transistor switch and said second CMOS transistor switch are 'ON', sand said first stage differential sense amplifier and said second stage global sense amplifier are 'OFF', said method comprising:
 initializing data access to said DRAM memory array;
 switching said first CMOS transistor switch and said second CMOS transistor switch are switched 'OFF', accessed said plurality of word lines transition 'HIGH' turning 'ON' an access transistor between a first cell storage capacitor associated with said local bit line true or a second cell storage capacitor associated with said local bit line complement;

developing a differential voltage across said local bit line true and said local bit line complement resultant from accessed said plurality of memory cells being turned 'ON';

transitioning said first timing pulse effectuating the setting of said first stage differential sense amplifier;

switching said first CMOS transistor switch and said second CMOS transistor switch 'ON'; and transitioning said global timing pulse effectuating the setting of said second stage global sense amplifier, wherein a full power supply voltage appears across said local bit line true and said local bit line complement.

7. The method in accordance with claim 6, wherein said first stage differential sense amplifier is immune to common mode noise.

8. The method in accordance with claim 7, wherein said second stage global sense amplifier is immune to common mode noise.

* * * * *